(12) United States Patent
Mosser, III et al.

(10) Patent No.: US 6,394,819 B1
(45) Date of Patent: *May 28, 2002

(54) DIELECTRIC MEMBER FOR ABSORBING THERMAL EXPANSION AND CONTRACTION AT ELECTRICAL INTERFACES

(75) Inventors: Benjamin Howard Mosser, III, Middletown; Keith McQuilkin Murr, Etters; James Paul Scholz, Mechanicsburg; Attalee Snarr Taylor, Palmyra; Mai-Loan Thi Tran, Harrisburg, all of PA (US)

(73) Assignee: The Whitaker Corporation, Wilmington, DE (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/182,042

(22) Filed: Oct. 29, 1998

(51) Int. Cl.⁷ ................................................ H05K 1/00
(52) U.S. Cl. ........................................ 439/83; 257/738
(58) Field of Search .............................. 439/67, 70, 71, 439/83, 876; 257/738

(56) References Cited

U.S. PATENT DOCUMENTS

| | | | |
|---|---|---|---|
| 4,847,136 A | 7/1989 | Lo | 428/195 |
| 4,861,272 A * | 8/1989 | Clark | 439/67 |
| 5,115,964 A | 5/1992 | Ameen et al. | 228/180.2 |
| 5,148,265 A | 9/1992 | Khandros et al. | 357/80 |
| 5,148,266 A | 9/1992 | Khandros et al. | 357/80 |
| 5,154,341 A | 10/1992 | Melton et al. | 228/180.2 |
| 5,233,504 A | 8/1993 | Melton et al. | 361/760 |
| 5,258,648 A | 11/1993 | Lin | 257/778 |
| 5,418,471 A * | 5/1995 | Kardos | 439/65 |
| 5,435,732 A | 7/1995 | Angulas et al. | 439/67 |
| 5,586,010 A | 12/1996 | Murtuza et al. | 361/751 |
| 5,591,941 A | 1/1997 | Acocella et al. | 174/266 |
| 5,593,322 A | 1/1997 | Swamy et al. | 439/660 |
| 5,663,530 A | 9/1997 | Schueller et al. | 174/260 |
| 5,691,041 A | 11/1997 | Frankeny et al. | 428/209 |
| 5,736,789 A | 4/1998 | Moscicki | 257/774 |
| 5,738,269 A | 4/1998 | Masterton | 228/248.1 |
| 5,744,758 A | 4/1998 | Takenouchi et al. | 174/255 |
| 5,751,556 A | 5/1998 | Butler et al. | 361/773 |
| 5,760,465 A | 6/1998 | Alcoe et al. | 257/669 |
| 5,772,451 A | 6/1998 | Dozier, II et al. | 439/70 |
| 5,784,262 A | 7/1998 | Sherman | 361/777 |
| 5,798,563 A | 8/1998 | Feilchenfeld et al. | 257/668 |
| 5,801,441 A | 9/1998 | DiStefano et al. | 257/696 |
| 5,801,446 A | 9/1998 | DiStefano et al. | 257/778 |
| 5,804,771 A | 9/1998 | McMahon et al. | 174/255 |
| 5,805,422 A | 9/1998 | Otake et al. | 361/749 |
| 5,810,607 A | 9/1998 | Shih et al. | 439/66 |
| 5,811,317 A | 9/1998 | Maheshwari et al. | 437/211 |
| 5,829,988 A | 11/1998 | McMillan et al. | 439/70 |
| 5,895,281 A | 4/1999 | Rothenberger | 439/326 |
| 6,257,904 B1 * | 7/2001 | Lin | 439/83 |

FOREIGN PATENT DOCUMENTS

| | | | |
|---|---|---|---|
| JP | 395601 | 6/2000 | |
| WO | WO 92/17921 | * 10/1992 | 439/67 |

* cited by examiner

Primary Examiner—Neil Abrams

(57) ABSTRACT

The invention is directed to a dielectric member interposed between two electrical components which have different coefficients of thermal expansion (CTEs). The dielectric member has conductive traces for electrically connecting the electrical components. The traces may be joined by solder balls to a printed circuit board. The dielectric member may include reservoirs for locating the solder balls and receiving solder after reflow of the solder balls. Adhesive layers may be used for bonding the traces to the dielectric member. The dielectric member is made of a material having a selected CTE value which minimizes the CTE mismatch at the electrical interface and effectuates absorption of the thermal expansion and contraction of the system. Stresses induced by thermal expansion and contraction at the electrical interface are thereby reduced, preventing problems such as fractured solder joints.

7 Claims, 6 Drawing Sheets

DIELECTRIC MEMBER FOR ABSORBING THERMAL EXPANSION AND CONTRACTION AT ELECTRICAL INTERFACES

FIELD OF THE INVENTION

The invention is directed towards a dielectric member for interposition between a first electrical component, such as an electrical socket, and a second electrical component, such has a printed circuit board, which has a preselected coefficient of thermal expansion (CTE) that relieves existing CTE mismatches between first and second electrical components.

BACKGROUND OF THE INVENTION

Interfaces between separate electrical components which are subjected to thermal cycling typically experience stresses caused by the different rates of expansion and contraction of each electrical component. For example, a first electrical component may have a low CTE while the second electrical component has a relatively higher CTE, indicating a greater degree of thermal expansion and contraction. In particular, electrical connectors mounted to printed circuit boards virtually always have higher CTE values than the printed circuit boards on which they are mounted. This CTE mismatch results in a relative motion between the first and second electrical components at their interface.

One arrangement which is particularly subjected to CTE mismatch is a microprocessor housed in a socket and mounted on a printed circuit board. In this arrangement, the components are subjected to extreme thermal cycling. The microprocessor generates heat during operation that is transferred to the electrical socket which houses the microprocessor. Because of the difference in base materials between the microprocessor and the electrical socket (the processor is typically made from a ceramic or resin material while the electrical socket is molded from an insulative plastic) a CTE mismatch is encountered at the processor/socket interface. The CTE mismatch at this interface is typically not problematic because there are no rigid points of electrical connection (e.g., solder joints) between the processor and the socket. Therefore, the difference in thermal expansion and contraction between the socket and the processor may be absorbed by the relatively tolerant electrical connections between the socket and the processor.

However, the electrical socket is typically soldered to a printed circuit board in a through-hole or surface mount configuration which requires rigid and relatively inflexible solder joints. And, as with the processor and the socket, the printed circuit board is subjected to fairly extreme thermal cycling which is also transferred to the electrical socket. Typical CTE values for printed circuit board materials fall between the range of 12 and 18 ppm/° C., which indicates relatively little expansion and contraction when subjected to thermal cycling. On the other hand, a molded electrical socket manufactured from an insulative plastic material may have CTE values ranging from approximately 15 to 70 ppm/° C. These CTE values indicate that the processor socket will expand and contract at a greater rate than the printed circuit board when subjected to thermal cycling. As a result, rigid electrical connections such as solder joints between the processor socket and the printed circuit board are subjected to induced stresses which frequently cause solder joints to fracture thereby causing electrical failure at the joint.

Efforts have been taken by electronics manufacturers to enhance or reinforce solder joints at the socket/pcb interface to prevent fracture and resulting electrical failure. However, these efforts too can produce unreliable results. For instance, it is difficult to ensure uniform solder joints when a large array of electrical contacts is used. This problem is frequently manifested in the occurrence of solder-wicking. Solder-wicking occurs when, by capillary action, solder flows along the electrical contact and away from the desired point of electrical interconnection. This results in a weaker, less reliable solder joint.

Accordingly it would be desirable to provide a way of accommodating or minimizing the effect of CTE mismatches between separate electrical components such as a processor socket and a printed circuit board. It would also be desirable to improve the reliability of solder joints between electrical components by improving their uniformity and inhibiting occurrences of solder-wicking.

SUMMARY OF THE INVENTION

In accordance with the objects of the present invention, a socket for receiving a semi-conductor package is provided having a housing with a plurality of electrical contacts. A dielectric is provided having a plurality of first conductive sites exposed on a top surface of the dielectric and a plurality of second conductive sites exposed on a bottom surface of the dielectric. The first and second conductive sites are electrically interconnected. The plurality of electrical contacts are electrically connected to the first conductive sites while the second conductive sites are connected to an electrical component.

A dielectric member for interposition between a first electrical component and a second electrical component is provided. A plurality of electrically conductive members are held within the dielectric member having an exposed top surface and an exposed bottom surface for electrical connection with the first electrical component and the second electrical component, respectively.

BRIEF DESCRIPTION OF THE DRAWINGS

Embodiments of the present invention will now be described in detail with reference to the accompanying drawings, in which.

DETAILED DESCRIPTION OF THE INVENTION

Figure 1:
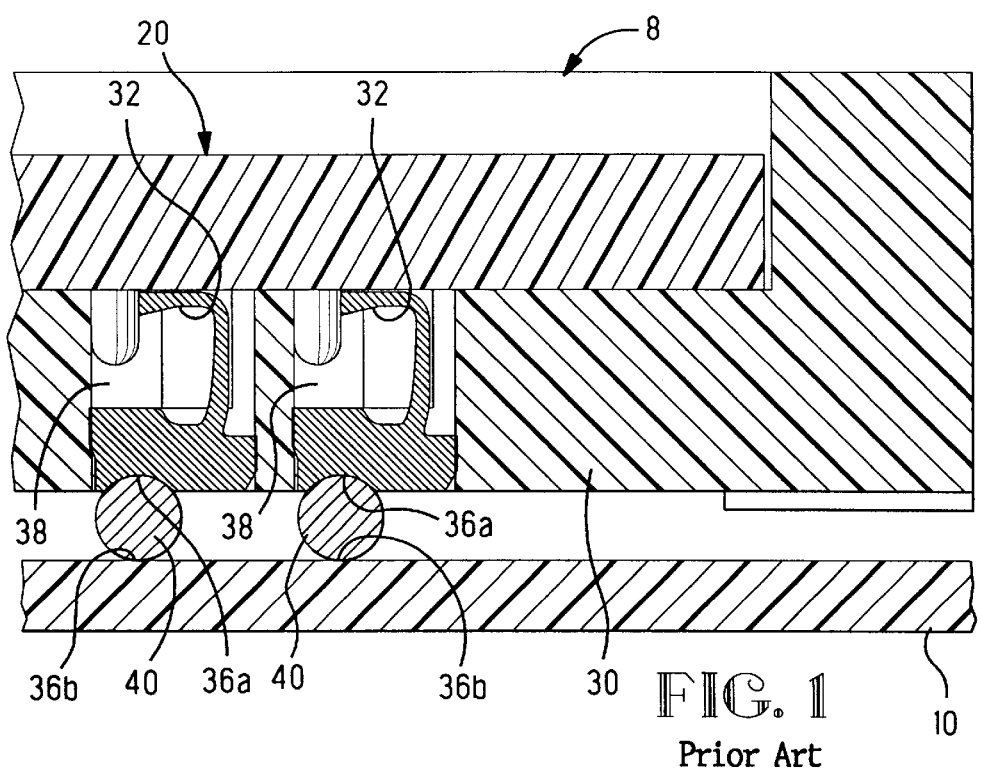
FIG. 1 is a partial cross-sectional side view of a prior art microprocessor socket mounted on a printed circuit board.

FIG. 1 is a cross-sectional side view of a conventional semi-conductor package 20 housed within a socket 30 and mounted to a printed circuit board 10 by way of solder balls 40. Upon soldering socket 30 to printed circuit board 10, interfaces 36a and 36b are created between the solder ball 40 and contact 32 and between solder ball 40 and pcb 10, respectively. These interfaces 36a, 36b are subjected to stresses induced by mismatches in the coefficients of thermal expansion (CTEs) of the socket and the printed circuit board. This mismatch in CTEs results in expansion and contraction due to thermal cycling occurring at different rates in the socket and the printed circuit board. The stresses experienced at interfaces 36a, 36b frequently result in cracking or fracturing of those solder joints, resulting in mechanical and electrical failure of at least part of the electrical assembly 8.

Another problem with the prior art configuration shown in FIG. 1 is that during the solder reflow operation when socket 30 is mounted onto printed circuit board 10, liquified solder balls 40 may, by capillary action, be drawn up along the sides of contacts 32 and away from printed circuit board 10 resulting in a weakened interface 36b. This problem, also known as solder-wicking, contributes to non-uniform solder joints and reduced electrical performance.

Figure 2:
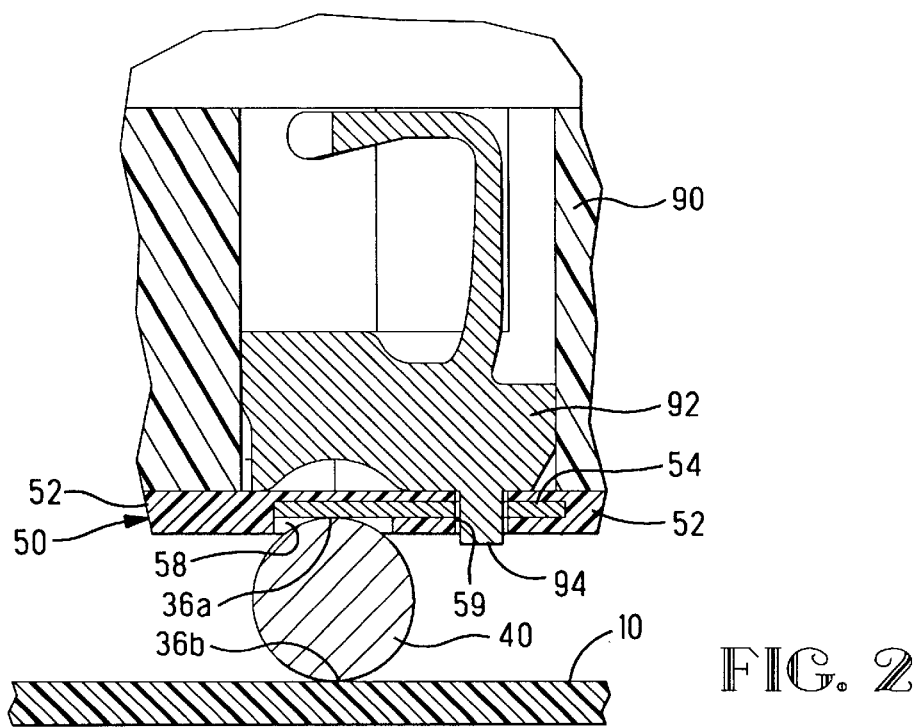
FIG. 2 is a partial cross-sectional side view of an embodiment of the present invention.

FIG. 2 shows a partial cross-sectional side view of an embodiment of the present invention in which an electrical component 90 houses electrical contact 92 having solder tail 94. Mounted beneath electrical component 90 is a dielectric member 50 disposed between solder ball 40 and solder tail 94 making electrical contact therebetween by way of conductive member 54. Electrical component 90 and dielectric member 50 are collectively mounted to a printed circuit board 10 by way of solder ball 40. Materials commonly used in manufacturing printed circuit boards have CTE values within the range of 12 to 18 ppm/° C. Under the teachings of the present invention, it is desirable to approximate the CTE value of dielectric member 50 to the CTE value of the printed circuit board 10. Approximating the CTE value of dielectric member 50 to the CTE of pcb 10, reduces stresses induced in solder joint interfaces 36a and 36b, thereby minimizing the potential for solder joint fracture.

In the embodiment shown in FIG. 2, the effects of CTE mismatch are minimized between printed circuit board 10 and electronic component 90 by selecting a dielectric member 50 comprised of a flexible film 52 which houses a compliant conductive trace 54. Various flexible film materials, such as polyimide films, may be used which offer a variety of CTE values. For instance, a material which sells under the tradename "Kapton" performs well with most printed circuit boards. The flexible film material 52 which is selected cooperates with the compliant conductive trace 54 to absorb the CTE mismatch which frequently exists between electrical component 90 and pcb 10. Electrical components having insulative housings molded from plastics may have CTE values up to 70 ppm/° C. and sometimes higher. As such, although a dielectric member 50 is implemented which has a CTE value approximating the CTE value of the pcb 10 a CTE mismatch frequently still exists between electrical component 90 and dielectric member 50. However, because of the compliancy of conductive trace 54 and because electrical contact 92 is typically not rigidly secured within electrical component 90, matching the CTE value of electrical component 90 with the CTE value of dielectric 50 is much less of a concern than matching CTE values of dielectric member 50 with that of pcb 10. In addition, as shown in FIG. 2, solder tail 94 is received in through-hole 59 of dielectric member 50 which inherently provides a more secure electrical connection than the solder interfaces at 36a and 36b of solder ball 40.

Accordingly, in order to accommodate the solder ball 40 and solder tail 94 arrangement shown in FIG. 2, dielectric member 50 is provided having a conductive trace 54 held within flexible film 52 wherein both the flexible film 52 and the conductive trace 54 have a through-hole 59 therethrough for receiving solder tail 94. Also, the bottom side of dielectric 50 has a recess 58 in the flexible film 52 which receives solder ball 40 allowing for electrical contact between solder ball 40 and conductive trace 54. This recess 58 performs the added function of serving as a solder reservoir for solder ball 40 upon solder reflow, thereby ensuring uniformity of solder joints and preventing solder-wicking.

Figure 3:
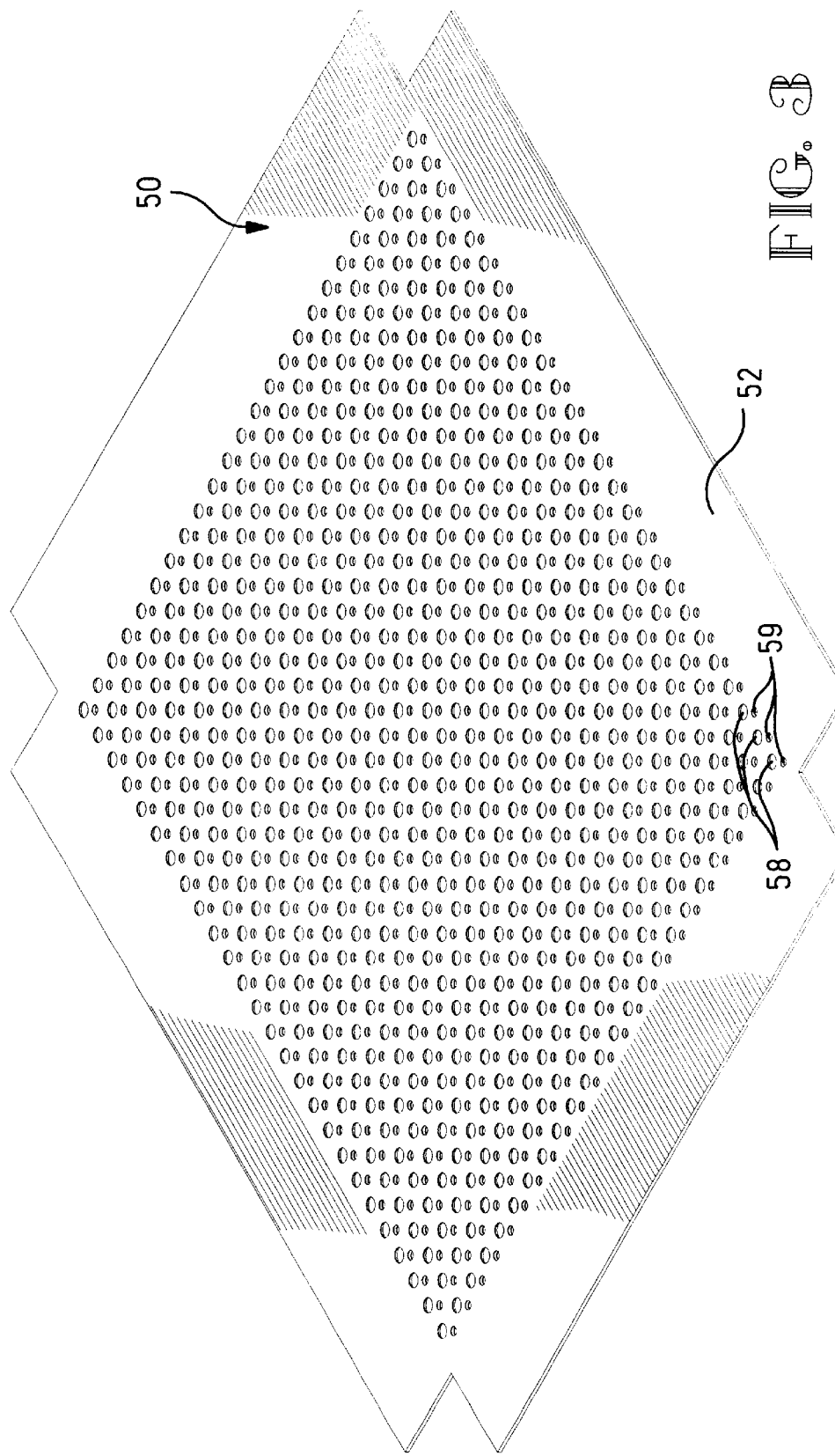
FIG. 3 is an isometric bottom view of a dielectric member which has been partially depopulated for clarity.

The arrangement shown in FIG. 2 lends itself well to applications requiring a large array of electrical contacts within an electrical component, such as that represented by reference number 90. For instance, microprocessors typically are packaged having large rectangular or square shaped arrays of pins that are received by socket housings which are in turn mounted onto printed circuit boards. As such, a dielectric member having a preselected CTE substantially matched to a printed circuit board would preferably be configured having an identical array as that required by the processor socket. FIG. 3 shows an isometric bottom view of dielectric member 50 having an array of through holes 59 in flexible film 52 for receiving an array of solder tails extending from a socket housing (not shown).

Figure 4:
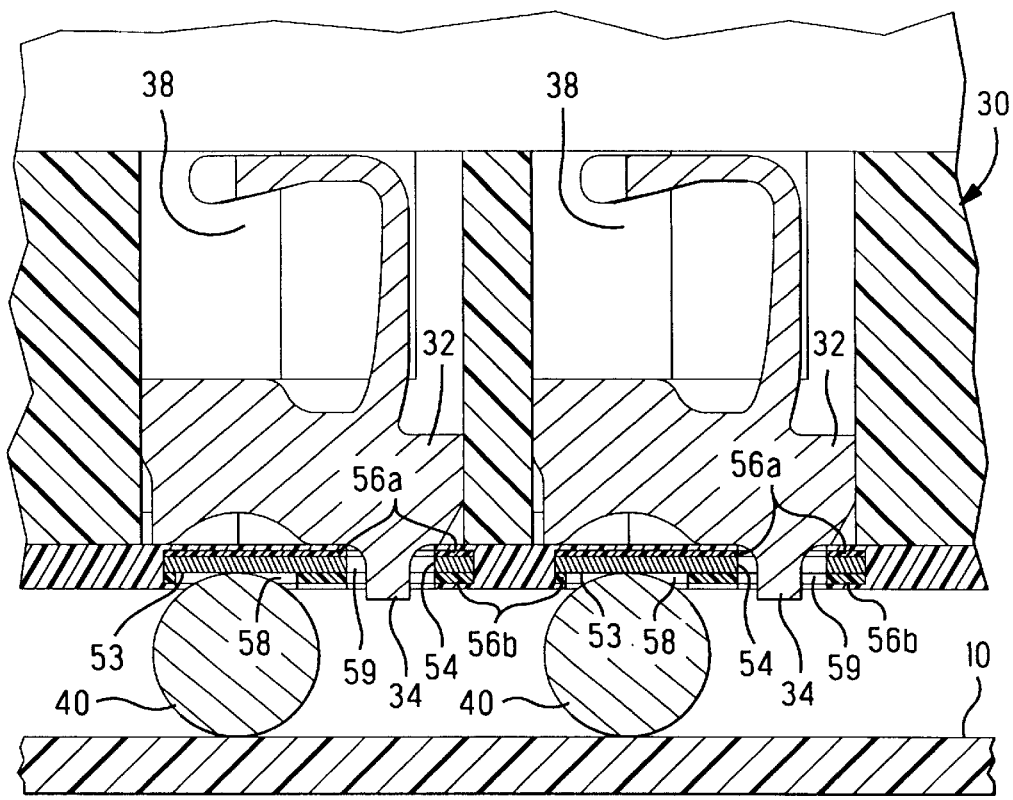
FIG. 4 is a partial cross-sectional side view of an embodiment of the present invention.

The dielectric member 50 shown in FIG. 3 is a particular embodiment which is further illustrated in FIG. 4. As shown in FIG. 4, socket housing 30 houses an array of electrical contacts 32 (for the sake of clarity, only two contacts are shown) having solder tails 34. Pins (not shown) from a semi-conductor package, such as a microprocessor, would be received in pin cavities 38, electrically mating with electrical contacts 32. Below the socket housing 30 is dielectric member 50 (also shown in FIG. 3) which receives solder tails 34 in through-holes 59. Dielectric member 50 is comprised of a flexible film material 52 which is preselected to have a CTE value which is sufficiently matched to the CTE value of printed circuit board 10 to effectively reduce undesirable stresses in solder joints 36a and 36b. Within the flexible film material 52 lie an array of conductive traces 54 which adhere to flexible film member 52 by way of adhesive layers of 56a and 56b shown on either side of conductive trace 54.

Figure 5:
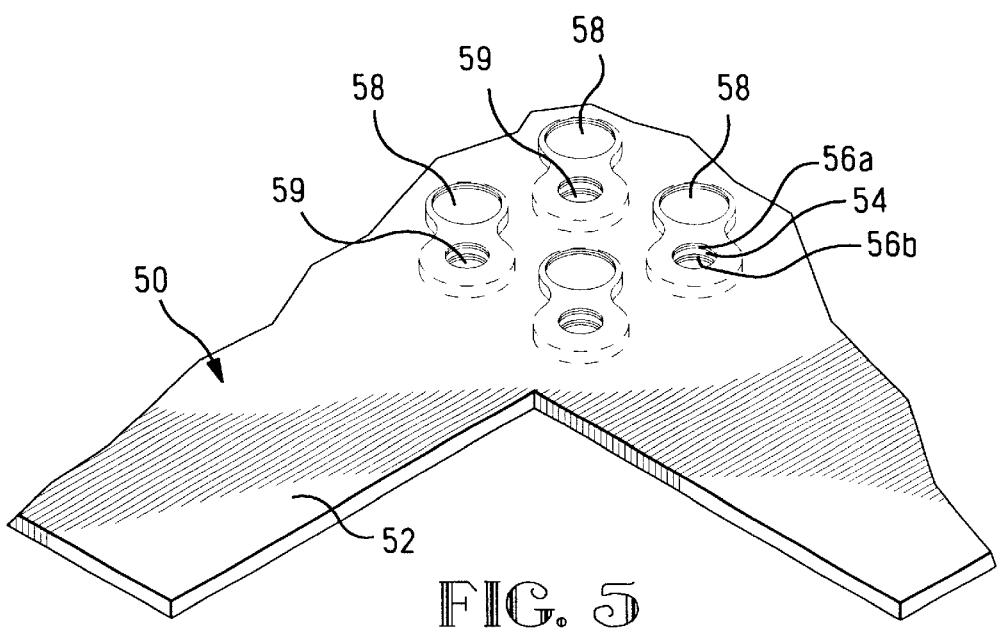
FIG. 5 is a partial isometric bottom view of the dielectric shown in FIG. 3 with conductive traces shown in phantom.
Figure 6:
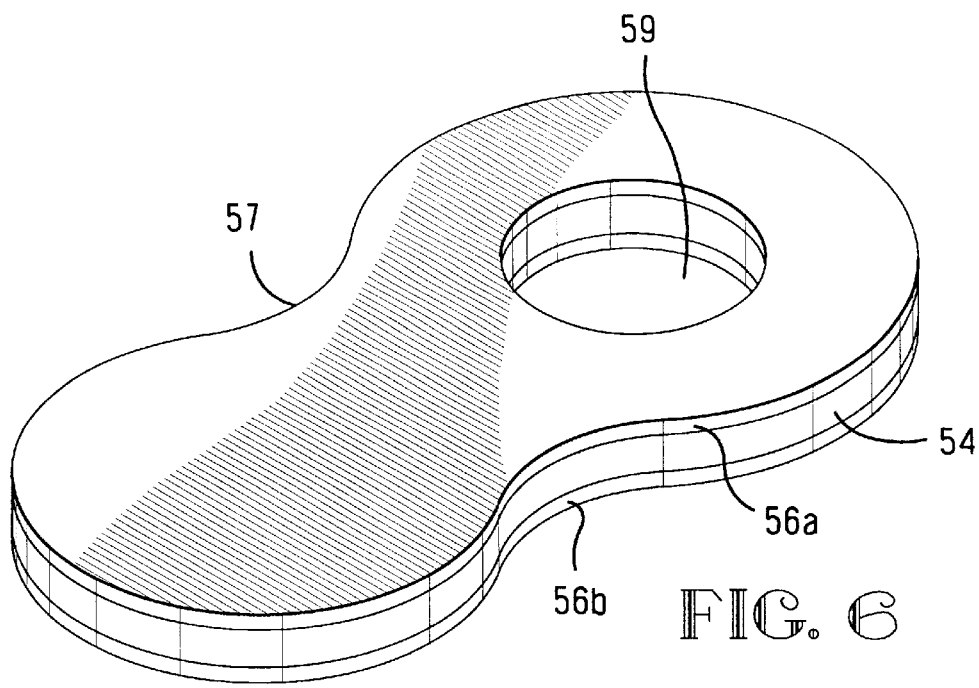
FIG. 6 is an isometric top view of the conductive trace shown in phantom in FIG. 5.
Figure 7:
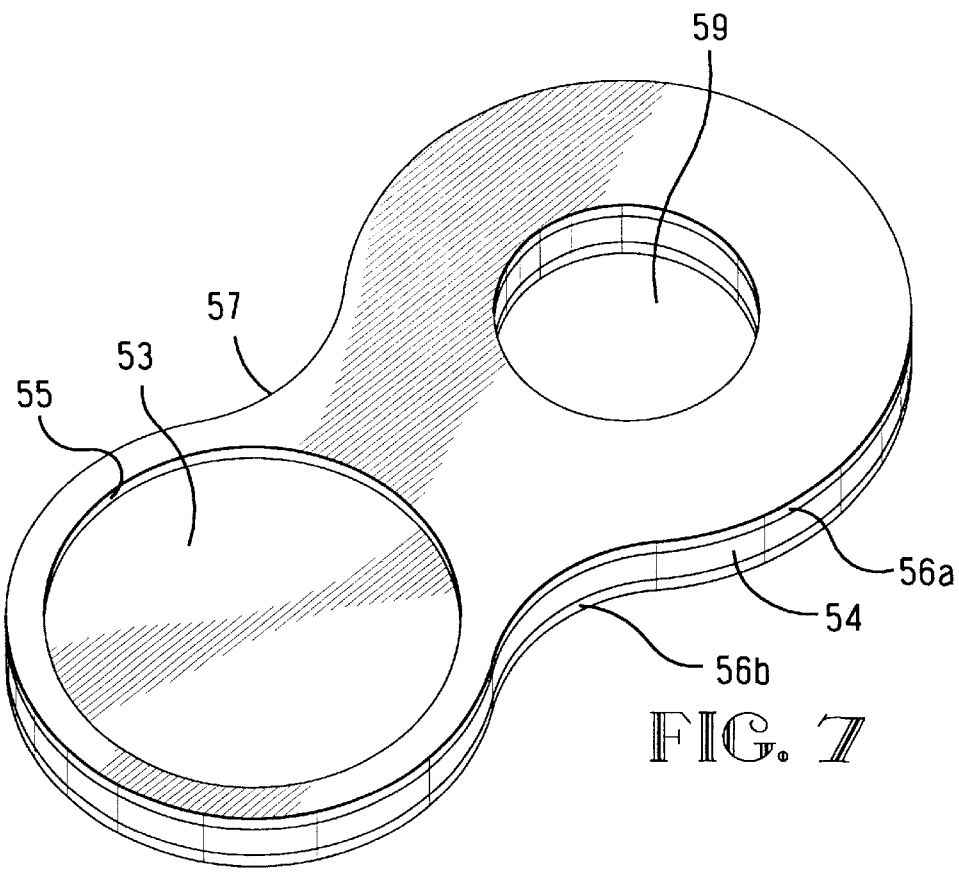
FIG. 7 is an isometric bottom view of the conductive trace shown in phantom in FIG. 5.

FIG. 5 shows a partial top isometric view of dielectric member 50 with conductive trace members 54 shown in phantom. FIGS. 6 and 7 are top and bottom isometric views, respectively, of the conductive trace member 54 shown in phantom in FIG. 5. FIGS. 6 and 7 illustrate an hour glass shaped conductive trace 54 sandwiched between adhesive layers 56a and 56b. Through-hole 59 is provided on one side of a necked-down portion 57 for receiving a solder tail 34 as shown in FIG. 4. And, as shown in FIG. 7, the bottom adhesive layer 56b has an opening 55 which exposes solder pad 53 for contacting solder ball 40 and defines a solder reservoir 58 as shown in FIG. 4. This solder reservoir 58 serves the purposes of both locating the solder balls 40 onto the solder pads 53 and containing the reflowed solder within the reservoir 58. Of course, other methods could be used to locate the solder balls 40 onto solder pads 53, such as providing holes through the solder pads which have relatively narrower diameters than the diameters of the solder balls.

Figure 8:
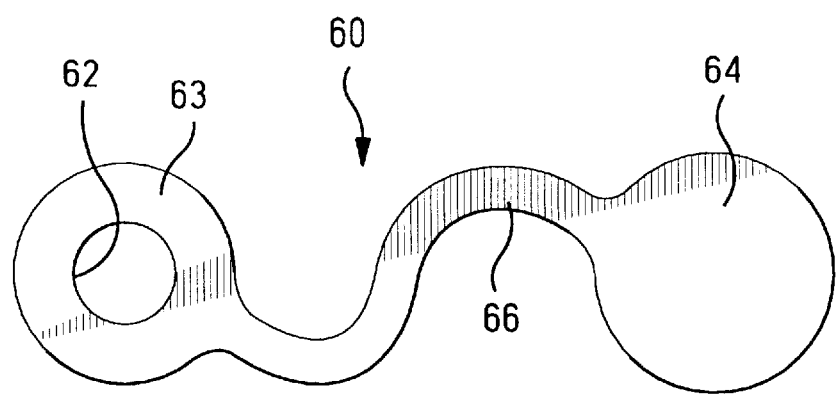
FIG. 8 is a top view of an alternative embodiment of the conductive trace shown in FIGS. 6 and 7.

The hour glass shape of conductive trace 54 may be modified to simplify manufacture of the dielectric member (for instance, a simple rectangular strip of a compliant conductive metal could be used) while more complex patterns may be employed to further enhance compliancy. One example of a modified conductive trace is shown in FIG. 8 wherein conductive member 60 is provided with a solder pad 64 and a portion 63 having through hole 62 connected by serpentine necked-down portion 66.

Figure 9:
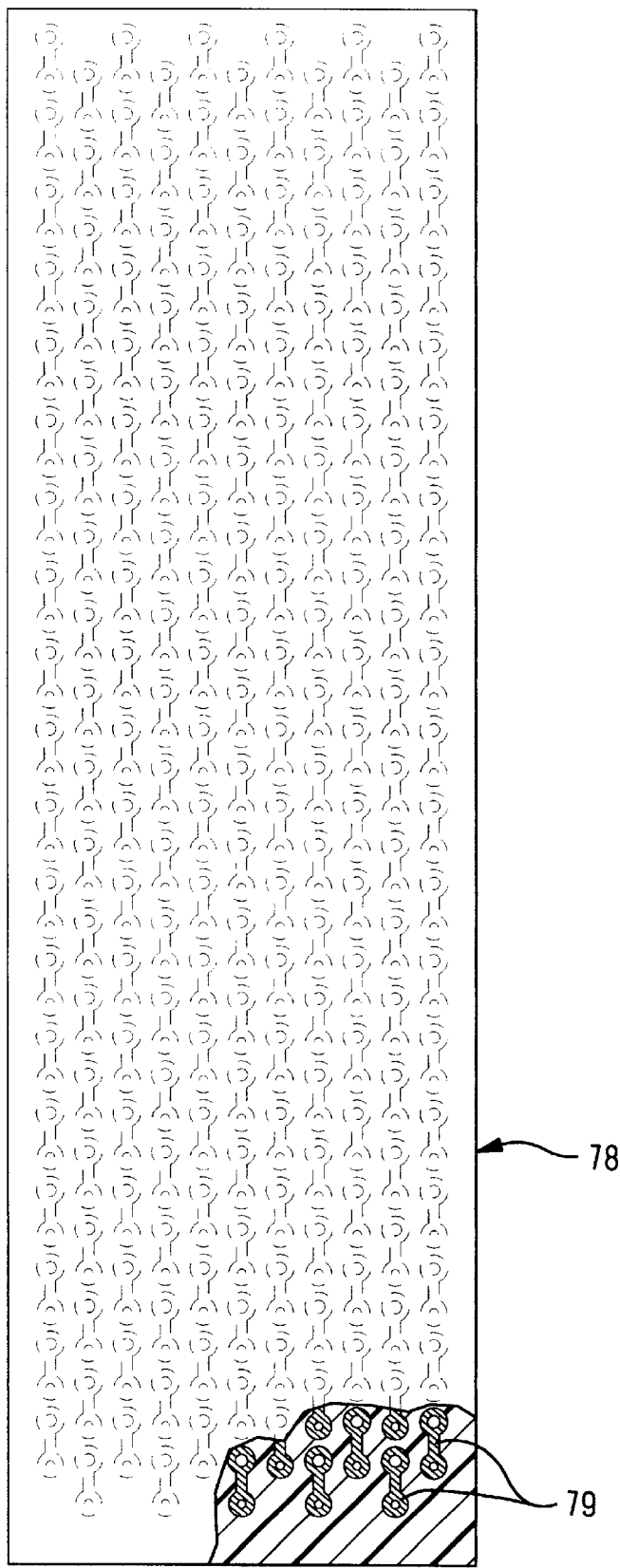
FIG. 9 is a top view of an alternative embodiment of the dielectric member of the present invention with a cut-away showing conductive members.

FIG. 9 shows another embodiment of the dielectric member of the present invention in which dielectric member 78 is constructed having a rectangular array of conductive traces 79 running lengthwise with the dielectric member. As suggested by FIG. 9, numerous shapes may be employed for the dielectric member in order to meet the requirements of the particular application. Also, the conductive traces may be arranged in various fashions within the dielectric member. Thus, the dielectric member may be easily adapted to meet the CTE requirements of countless electronics applications. And, just as the parameters of the dielectric may be adjusted, so too may the conductive traces be modified to maximize the performance of the dielectric member. For instance, the conductive metal used as the conductive trace may be selected based on the CTE value of the particular metal. For example, a conductive trace made of copper would typically have a CTE of about 20 ppm/° C., but other conductive materials having higher or lower CTE values could be used to further "tune" the system.

Figure 10:
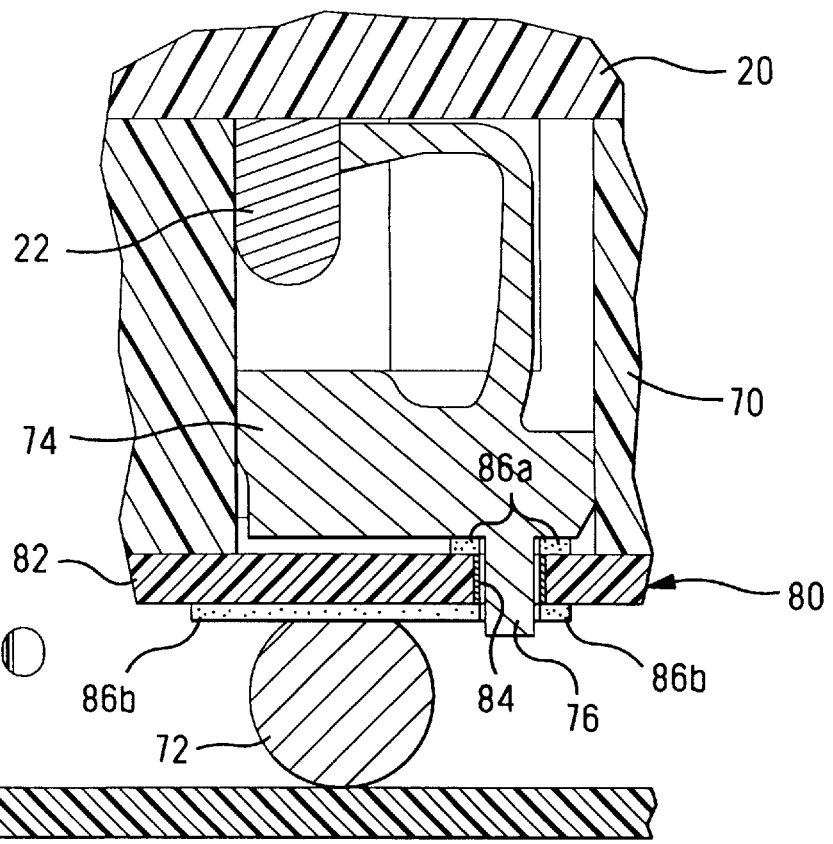
FIG. 10 is a partial cross-sectional side view of an alternative embodiment of the present invention.

Another embodiment of the present invention is shown in FIG. 10 in which dielectric member 80 has an alternative configuration. Similar to the design in FIG. 4, socket housing 70 houses an array of electrical contacts 74 having solder tails 76. This socket housing 70 receives an array of pins 22 which extend from a semi-conductor package 20 such as a microprocessor and which electrically mate with contacts 74. Disposed beneath socket housing 70 is dielectric member 80 which may be manufactured from flexible film having CTE values which approximate CTE values of printed circuit board 10 or, as shown, may be constructed of a printed circuit board material. This alternative provides the added advantage of being able to identically match the CTE value of the dielectric member 80 with the CTE value of the printed circuit board 10 by selecting identical materials. In this embodiment, dielectric member 80 is provided with solder pads 86a and 86b disposed on either side of the printed circuit board material 82 and electrically connected by plated through-hole 84. Solder tail 76 of electrical contact 74 is then disposed within the plated through-hole 84 for electrically contacting solder ball 72 which is affixed to solder pad 86b. Although in this configuration no solder reservoir is created, occurrences of solder-wicking are still reduced by offsetting the through-hole 84 and solder ball 72 and by providing a more inhibitive barrier through the use of a dielectric member 80.

It should be apparent from the foregoing description that the present invention provides an effective way of minimizing the negative effects of CTE mismatch at electrical interfaces of separate electrical components. And, although particular reference has been made to microprocessor sockets mounted onto printed circuit boards, it should be clear that various electrical components would benefit from the solution to CTE mismatch set forth in the present invention. That is, electrical interfaces that exist between electrical components having different CTE values, may be subjected to stresses induced by thermal expansion and contraction. The use of a dielectric member constructed of a material having a desired CTE that approximates the CTE of at least one of the electrical components would serve to absorb a CTE mismatch at the interface, thereby reducing the potential for electrical failure.

It should also be apparent that the conductive traces or solder pads referred to throughout the description could be manufactured from various conductive materials and arranged in a variety of patterns to suit the particular application. For instance, copper traces could be used to common selected pins of a semiconductor package, creating in effect a programmable dielectric member.

The dielectric member of the present invention and many of its attendant advantages will be understood from the foregoing description. It is apparent that changes may be made in the form, construction, and arrangement of parts thereof without departing from the spirit of the invention, or sacrificing all of its material advantages. Thus, while several embodiments of the invention have been disclosed, it is to be understood that the invention is not strictly limited to those embodiments but may be otherwise variously embodied and practiced within the scope of the appended claims.

We claim:

1. A socket for receiving a semiconductor package, comprising:

a housing having a plurality of electrical contacts;

a flexible film dielectric having a top surface, a bottom-surface and a conductive trace provided there between, a plurality of first conductive sites provided on the conductive trace and accessible via apertures in the top surface of the flexible film dielectric and a plurality of second conductive sites provided on the conductive trace and being electrically interconnected to the first conductive sites;

a solder receiving recess provided in the bottom surface of the flexible film dielectric and extending to the conductive trace, the recess provided to act as a solder reservoir and to properly position respective solder devices relative to the second conductive sites;

respective first conductive sites and respective second conductive sites are disposed directly beneath respective electrical contacts;

wherein respective ones of the plurality of electrical contacts are electrically connected to the first conductive sites and the second conductive sites are connected to an electrical component.

2. The socket of claim 1, wherein the dielectric has a coefficient of thermal expansion lower than the coefficient of thermal expansion of the housing and greater than or equal to the coefficient of thermal expansion of the printed circuit board.

3. The socket of claim 1, wherein each first conductive site and each second conductive site is formed on a compliant electrically conductive member held within the flexible film dielectric.

4. The socket of claim 3, wherein each compliant electrically conductive member has a narrowed portion between the first and second conductive sites.

5. The socket of claim 3, wherein the electrically conductive site has a through-hole for receiving a solder tail of the electrical contact and the second conductive site is a solder pad for connecting to a solder ball.

6. The socket of claim 5, wherein the flexible film dielectric defines a reservoir about the exposed second conductive site for containing solder upon reflow of the solder ball.

7. The socket of claim 1, wherein the flexible film dielectric is a polyimide material.

* * * * *